(12) United States Patent
Mizerak et al.

(10) Patent No.: US 11,191,184 B2
(45) Date of Patent: Nov. 30, 2021

(54) DIRECT CONTACT FLUID BASED COOLING MODULE

(71) Applicant: Jetcool Technologies Inc., Littleton, MA (US)

(72) Inventors: Jordan Mizerak, Boston, MA (US); Bernard Malouin, Westford, MA (US)

(73) Assignee: Jetcool Technologies Inc., Littleton, MA (US)

( * ) Notice: Subject to any disclaimer, the term of this patent is extended or adjusted under 35 U.S.C. 154(b) by 0 days.

(21) Appl. No.: 15/931,220

(22) Filed: May 13, 2020

(65) Prior Publication Data
US 2020/0352053 A1 Nov. 5, 2020

Related U.S. Application Data

(63) Continuation of application No. PCT/US2020/027589, filed on Apr. 10, 2020.
(Continued)

(51) Int. Cl.
*H05K 7/20* (2006.01)
*H05K 1/18* (2006.01)
(Continued)

(52) U.S. Cl.
CPC ......... *H05K 7/20272* (2013.01); *H05K 7/205* (2013.01); *H05K 1/0209* (2013.01); *H05K 1/181* (2013.01); *H05K 5/061* (2013.01)

(58) Field of Classification Search
CPC . H01L 23/473; H01L 23/4735; H01L 23/467; H01L 23/4006; H05K 7/20772;
(Continued)

(56) References Cited

U.S. PATENT DOCUMENTS 6,729,383 B1 5/2004 Cannell et al.
7,265,976 B1 9/2007 Knight
(Continued)

OTHER PUBLICATIONS

The International Search Report and The Written Opinion of the International Searching Authority dated Jul. 29, 2020 for PCT Application No. PCT/US20/27589.

*Primary Examiner* — Adam B Dravininkas
(74) *Attorney, Agent, or Firm* — Wolf, Greenfield & Sacks, P.C.

(57) ABSTRACT

A fluid delivery module that produces direct fluid-contact cooling of a computer processor, while mating with common processor accessory mounting specifications. Computer processors are commonly packaged and installed on printed circuit boards. The fluid module delivers cooling fluid directly to at least a surface of the processor package. The fluid module forms a fluid-tight seal against the surface of the processor package. By delivering fluid to the surface of the processor package, the module cools the computer processor. The module does not mechanically fasten to the processor. Instead, the module fastens to a variety of processor accessory mounting patterns commonly found on printed circuit boards. The printed circuit board typically carries the processor. This minimizes stress on the processor package, and allows greater modularity between different processors. In one embodiment, the fluid delivery is done with integral microjets, producing very high heat transfer cooling of the computer processor.

24 Claims, 18 Drawing Sheets

Related U.S. Application Data

(60) Provisional application No. 62/833,745, filed on Apr. 14, 2019.

(51) Int. Cl.
*H05K 1/02* (2006.01)
*H05K 5/06* (2006.01)

(58) Field of Classification Search
CPC ........... H05K 7/20254; H05K 7/20272; H05K 7/20345; H05K 7/20927; H05K 7/20736; H05K 7/20727; H05K 7/2079; H05K 7/20218; H05K 7/20509; H05K 7/20; H05K 1/0209; H05K 1/181
See application file for complete search history.

(56) References Cited

U.S. PATENT DOCUMENTS

| | | | |
|---|---|---|---|
| 7,978,473 B2 | 7/2011 | Campbell et al. | |
| 9,165,857 B2 | 10/2015 | Song et al. | |
| 9,559,038 B2 | 1/2017 | Schmit et al. | |
| 2004/0069451 A1* | 4/2004 | Meyer | H01L 23/473 165/80.2 |
| 2005/0280994 A1* | 12/2005 | Yazawa | H01L 23/34 361/699 |
| 2006/0250774 A1* | 11/2006 | Campbell | H01L 23/4735 361/699 |
| 2007/0017659 A1* | 1/2007 | Brunschwiler | H01L 23/427 165/80.4 |
| 2007/0221364 A1* | 9/2007 | Lai | H01L 23/4735 165/80.4 |
| 2007/0274045 A1* | 11/2007 | Campbell | F28F 7/00 361/699 |
| 2007/0295480 A1 | 12/2007 | Campbell et al. | |
| 2008/0037221 A1* | 2/2008 | Campbell | H01L 23/4735 361/699 |
| 2009/0284821 A1* | 11/2009 | Valentin | B32B 17/10761 359/273 |
| 2011/0277491 A1* | 11/2011 | Wu | F28D 15/046 62/177 |
| 2012/0063091 A1* | 3/2012 | Dede | H05K 7/20927 361/699 |
| 2014/0205632 A1* | 7/2014 | Gruber | A61P 31/12 424/204.1 |
| 2015/0208549 A1* | 7/2015 | Shedd | F28F 13/02 165/104.27 |
| 2018/0124949 A1* | 5/2018 | Marroquin | H01L 23/473 |
| 2020/0027819 A1* | 1/2020 | Smith | H01L 23/46 |

* cited by examiner

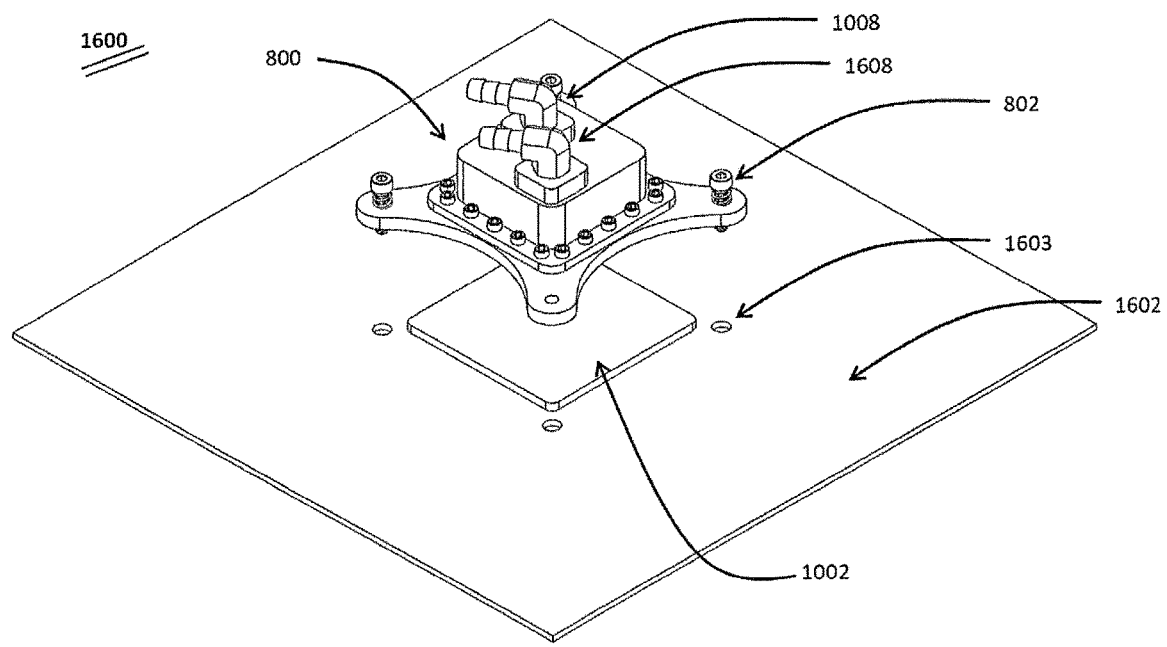
*Figure 16*
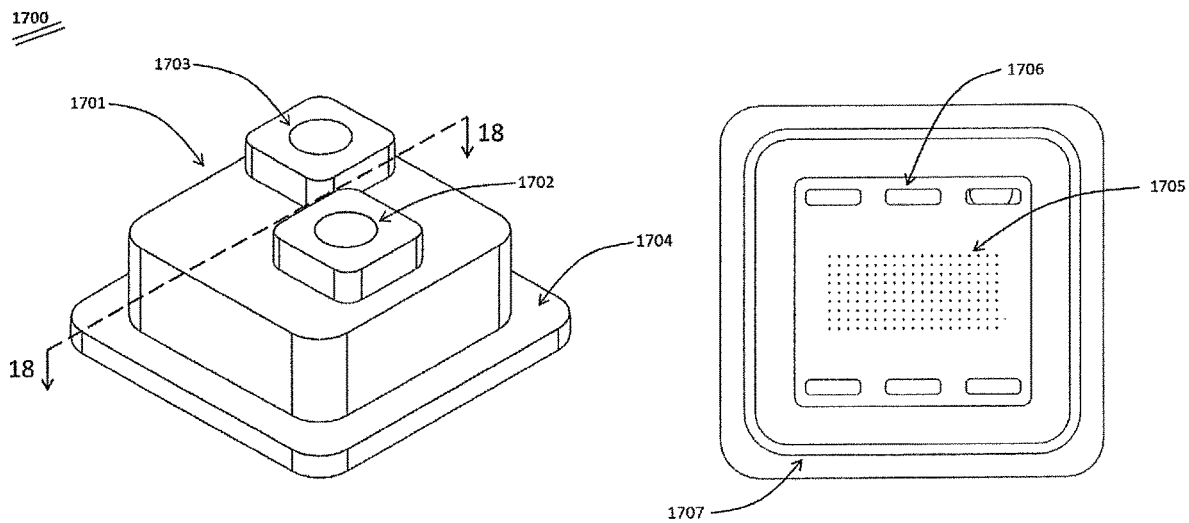
*Figure 17A*  *Figure 17B*

DIRECT CONTACT FLUID BASED COOLING MODULE

CROSS-REFERENCE TO RELATED APPLICATION

This application claims the benefit under 35 U.S.C. § 120 as a continuation of International Patent Application No. PCT/US20/27589 filed on Apr. 10, 2020, which claims the benefit under 35 U.S.C. § 119(e) of U.S. Provisional Patent Application 62/833,745, filed on Apr. 14, 2019. The entire disclosures of both applications are incorporated herein by reference for all purposes.

BACKGROUND

This disclosure relates to cooling of electronic components.

Fueled by data, machine learning, virtual reality, and artificial intelligence, the demand for processing power continues to increase. Modern data centers, for instance, host racks of hundreds or thousands of individual processors (e.g., CPUs, GPUs, or ASICs). In this quest for greater computational power, advances in fabrication processes have allowed chip designers to build smaller processors with higher power density. With this increase in power density comes the need to remove the heat that is dissipated from these devices.

Current approaches to cooling computer processors involve the attachment of a metal heat sink (liquid- or air-cooled) to the processor package by using a thermal paste and then fastening the metal heat sink to standard mounting patterns located on the circuit board that hosts the processor. These strategies have been effective but suffer from performance that cannot keep pace with processor power advancements. Further, these solutions require large, heavy, expensive metal heat sinks to help dissipate the heat. Their large size and weight can stress the processor package and circuit board. Continued growth of these heat sinks further limits the achievable packing density of processors in data centers, computer cases, and application-specific printed circuit boards.

Traditional approaches also use a thermal paste to thermally attach these large heat sinks. Using thermal paste to attach heat sinks to electronic devices produces an assembly with an overall effectiveness that hinges on the durability and lifetime of the thermal paste that connects the heat sink to the processor's package. Degradation of this thermal paste over time can lead to reduced performance, or device failure.

SUMMARY

It would, therefore, be useful to have a processor heat sink that: had greater thermal performance; came in a compact package size; eliminated the need for thermal paste; and could be used with existing and future processor mechanical mount specifications.

In one aspect, a direct-contact single-phase fluid-based cooling module includes a manifold comprising a fluid inlet that is fluidly coupled to a fluid outlet and manifold mounting structures that are configured to fix the manifold to a separate structure such that the manifold is configured to form a fluid-tight seal against a surface of an electronic component, such that direct contact is established between the fluid and the electronic component.

Some examples include one of the above and/or below features, or any combination thereof. In an example the manifold mounting structures are located outside the extent of the adjacent electronic component to be cooled. In an example fluid contacts only exterior surfaces of the electronic component. In an example the fluid passes from the inlet, within the electronic component, and to the outlet, for purposes of better heat transfer. In some examples the manifold mounting structures are configured to fix the manifold to a printed circuit board. In an example the manifold mounting structures are configured to fix the manifold to a processor accessory mount pattern of the printed circuit board.

Some examples include one of the above and/or below features, or any combination thereof. In an example the manifold mounting structures comprise a pre-loading component to produce a robust seal on the electronic component. In an example the direct-contact fluid-based cooling module further includes a compressible sealing element between the manifold and the electronic component, to facilitate the fluid-tight seal. In an example the manifold further comprises internal ribs or fins that increase a surface area of the manifold that is exposed to the fluid or enhance fluid flow, for enhancing heat transfer. In an example the inlet and outlet are in fluid communication with fluid fittings. In an example the inlet and outlet are in fluid communication with fluid conduits.

Some examples include one of the above and/or below features, or any combination thereof. In some examples the manifold further comprises a fluid plenum that fluidly couples the inlet and the outlet, and wherein fluid in the plenum contacts the surface of the electronic component. In an example the manifold further comprises a nozzle plate that defines a plurality of orifices that are configured to create jets that are directed at the surface of the electronic component. In an example the nozzle plate divides the fluid plenum into an inlet plenum and an outlet plenum, wherein the fluid pressure is lower in the outlet plenum than it is in the inlet plenum. In an example the nozzle plate further defines at least one outlet fluid passageway that is configured to conduct fluid from the outlet plenum toward the fluid outlet of the manifold. In an example a perimeter can be drawn around the plurality of orifices without enclosing any of the outlet fluid passageways. In some examples the orifices contain chamfers on a surface of the plate. In an example the orifices form microjet nozzles. In an example the microjet nozzles direct the fluid in a direction substantially perpendicular to a surface of the nozzle plate, to create fluid flow with substantially high momentum in the perpendicular direction. In an example the orifices are configured non-uniformly across the nozzle plate, to provide more effective cooling for reduction of temperature gradients in the electronic component.

BRIEF DESCRIPTION OF THE DRAWINGS

For a better understanding of the present disclosure, reference is made to the accompanying drawings, in which:

FIG. 16 shows an isometric exploded assembly view depicting a microjet direct contact fluid module interfacing with the electronic device and mounting board.

FIGS. 17A and 17B show an alternative embodiment of a microjet direct contact fluid module, with the microjet features built into the reservoir cap, in isometric and bottom views.

FIG. 22B is a cross-section taken along line 22B-22B, FIG. 22A.

DETAILED DESCRIPTION

Figure 1:
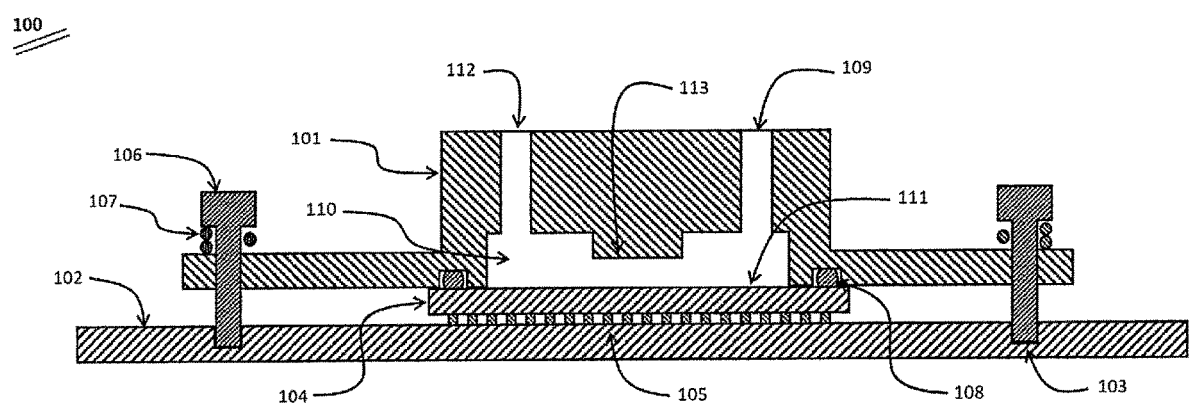
FIG. 1 shows a cross sectional view of a direct contact fluid based cooling module, disposed on a CPU and attached to the CPU motherboard.

This disclosure describes the use of a structure (e.g., a mounting plate) with an integral fluid module designed to deliver coolant fluid in direct contact with the surface of a computer processor package. In an example the structure is a mounting plate that is configured to form a leak-free seal against the processor package, while fastening to common accessory mounting features on a host printed circuit board for the processor. The disclosure further describes several non-limiting embodiments of the direct contact fluid-based cooling modules, including those for cooling the exterior surface of a computer processor package. Commonly available accessory mounts found on printed circuit boards can be used to introduce a compact way to deliver cooling fluid in direct contact with the exterior surface of a computer processor package, while maintaining modularity across many types of processor packages.

Many computer processor assemblies involve a packaged semiconductor device that is installed onto a printed circuit board. Encapsulating this semiconductor device is a cover that may serve several purposes including mechanical protection and heat transfer. Regarding heat transfer, this cover is oftentimes insufficient by itself to dissipate the heat from the processor, and a large, finned, metal heat sink is then attached. This approach leads to complex, low performance, large overall implementations.

Yet other approaches involve liquid cooling of the computer processor. Here, the greater heat transfer abilities of liquids are exploited, traditionally by passing the cooling liquid through a finned, conductive metal heat exchanger that is attached to the processor by a thermal paste or epoxy. These approaches, too, include the separate, large heat sinks of other approaches, but use a pressurized liquid instead of air as the cooling medium. This leads to more capable thermal solutions, but still uses a large, expensive, metal package that relies on thermal paste to couple the thermal management solution to the device.

As opposed to a separate liquid heat exchanger, direct contact cooling as disclosed herein can provide high performance cooling without the need for thermal pastes. Microjet cooling, for example, is a technique for cooling high-power devices that is characterized by fluid moving through a nozzle to form a small jet of fluid with substantially greater momentum in one direction than another. When this high-momentum fluid impacts a surface, it suppresses the thermal boundary layer at that surface, producing very high heat transfer at that spot. Microjet cooling technology has been demonstrated to produce heat transfer coefficients in excess of 200,000 $W/m^2K$, more than ten times that of competing approaches (e.g., microchannels≈20,000 $W/m^2K$). This allows the fluid to collect more heat, without the need for additional metal heat spreaders or thermal pastes. Microjet cooling is further described in US Patent Application Publication 2019/0013258 and International Patent Application Publication WO 2019/018597, the disclosures of which are incorporated herein by reference in their entireties for all purposes.

In one non-limiting aspect of the present disclosure, direct contact microjet cooling is configured within a fluid module, with modular mounts for computer CPUs. In an example the assembly is fastened not to the processor, but to the printed circuit board that hosts the processor. During the installation, a leak-free seal is formed between the fluid module and the processor, where direct contact fluid cooling by microjet impingement is produced on the surface of the processor package. This approach yields high-performance cooling in a compact size, eliminates the need for thermal pastes, and does not fasten to the individual processor but instead to existing mounting features on many printed circuit boards, thus achieving greater modularity.

This disclosure is not limited to the use of microjet cooling. Rather, the disclosure describes direct contact fluidic cooling of computer processors (CPUs, GPUs, FPGAs, ASICs, etc.) using a fluid module with modular mounts that fasten to the processor motherboard, while also forming a leak-free seal against at least one surface of the processor package.

FIG. 1 shows a cross section of one embodiment of a direct contact fluid based cooling module for processors (100). A manifold (101) is disposed above a packaged computer processor (104). This packaged processor (104) is disposed on a printed circuit board (102), for example, by an array of pins (105). Of course, other methods of attaching the processor (104) to the circuit board (102) may be used, including a combination of different methods. The manifold is configured with mounting holes or other features to allow fasteners (106) to fasten the manifold to a component or structure (here, the printed circuit board (102)) and not to mechanically affix to the processor (104). Such fastener attachment to the printed circuit board (102) may be accomplished using features (103) on or within the printed circuit board (102). Such features (103) may include, for example, holes with nuts, quarter-turn cam locks, or threaded inserts. For widespread applicability and modularity, the fasteners (106) may be configured for compatibility with standard processor mount specifications, for example, LGA-2011, LGA-1366, or LGA-2011, or common processor accessory mount patterns, for example, 80 mm square patterns. Of course, other methods are possible.

The specific method of fastening the manifold (101) to the printed circuit board (102) is carefully selected to mate with existing circuit board features (103) for each processor technology. For example, threaded screws (106) or quarter-turn fasteners may be used as the fastening method. The fastener may also include features to pre-load the manifold against the processor package, for example with compression springs (107) disposed between the manifold surface and the fastener bearing surface.

When fastened to the printed circuit board (102), the manifold forms one or more leak-free seals (108) against a surface of the processor package. In FIG. 1, a leak-free seal is illustrated to contain fluid within the plenum (110) formed between the manifold and the processor surface (111). The one or more leak-free seals formed with the processor package may be accomplished by, for example, O-rings, gaskets, or elastomeric materials.

In operation, a source of pressurized fluid is supplied to the manifold. The manifold includes one or more fluid inlets (109) to accept this source of pressurized fluid. The fluid fills and traverses internal cavity (110) before exiting the manifold through one or more exit ports (112). While flowing from inlet (109) to outlet (112), the fluid is in direct contact with, and flows over, processor surface (111). Heat is then transferred between the device surface and the fluid. This heat transfer may be used to cool the processor, without a need for thermal pastes or greases, or an additional large, finned heat sink. Manifold (101) may also include internal ribs or fins (113) for increased heat transfer area or fluid flow control. Such ribs or fins (113) may extend from the manifold into the fluid, or all the way to the device surface.

In use, a single-phase fluid is administered. This fluid may be any suitable coolant, including air, water, ethylene glycol, propylene glycol, ethanol, R134A, ammonia, or any other fluid. A combination of two or more of these fluids may also be used.

The inlet (109) and outlet (112) may be of any type. They may also, for example, provide transmission to/from other components that require cooling. Such other components may be in neighboring parts of the assembly and may utilize transmission via tubing to other parts of the system. The inlet and outlet may interface with a fitting (e.g. barb, quick disconnect, compression), tubing, a manifold, or any other suitable method of interfacing fluids.

Figure 2:
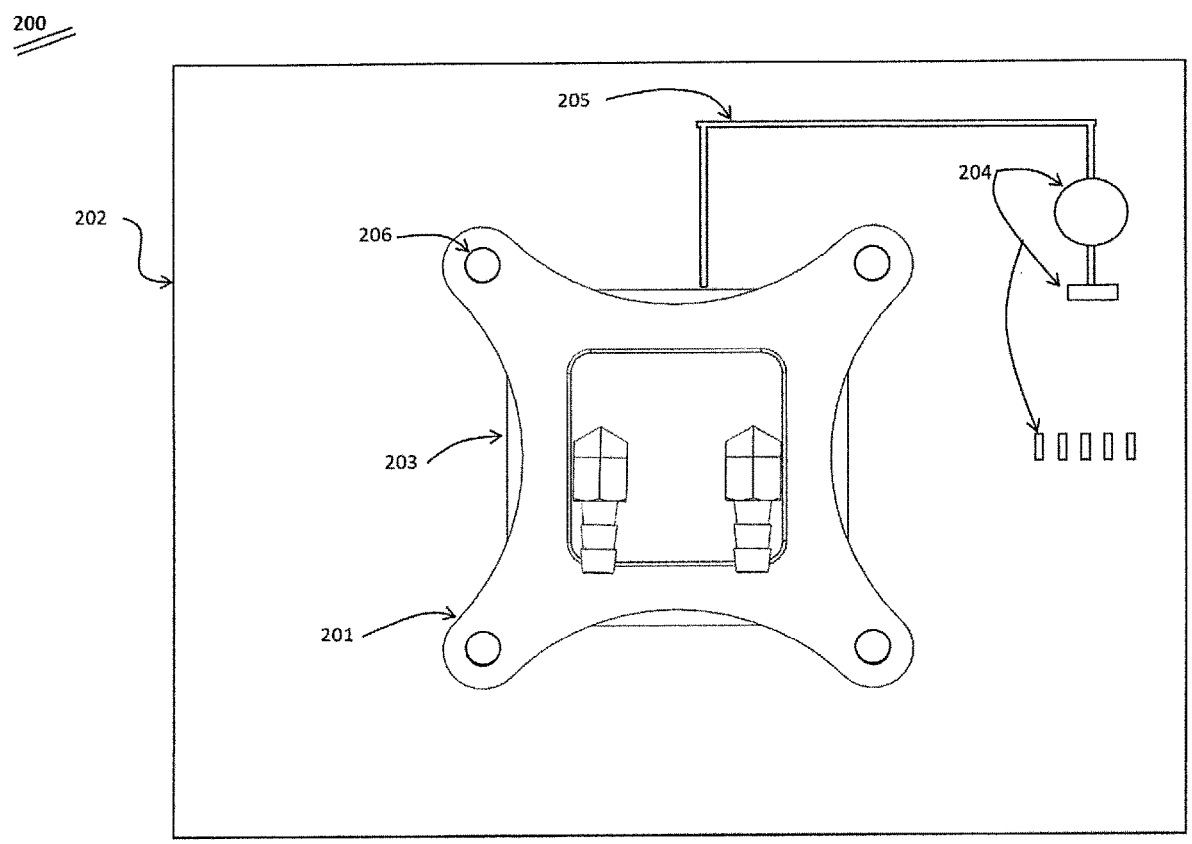
FIG. 2 shows a top view of a direct contact fluid based cooling module, disposed on a CPU, and attached to the CPU motherboard.

FIG. 2 shows a top view of one installation (200) with a direct contact fluid manifold (201) disposed on a printed circuit board (202). The fluid manifold (201) is affixed to the circuit board by mechanical fasteners (206) and complementary features on the circuit board (not in view). Disposed on the printed circuit board (202), and between the circuit board and the fluid manifold (201), is a processor package (203). The processor package (203) may be that, for example, of a CPU, GPU, ASIC, or FPGA. Also disposed on the circuit board (202), for example, may be other components (204) or electrical traces (205) that are not in mechanical or fluidic communication with the fluid manifold.

In a volume between the fluid manifold (201) and the printed circuit board (202), there exists a processor package (203). The fluid manifold is in contact with at least one surface of the processor package and forms a leak-free seal. However, the fluid manifold does not mechanically fasten or affix to the processor package. This minimizes mechanical stress on the electrical component and simplifies the mounting architecture by instead leveraging standard mechanical mounting specifications for processor accessories that are found on many circuit boards.

Figure 3:
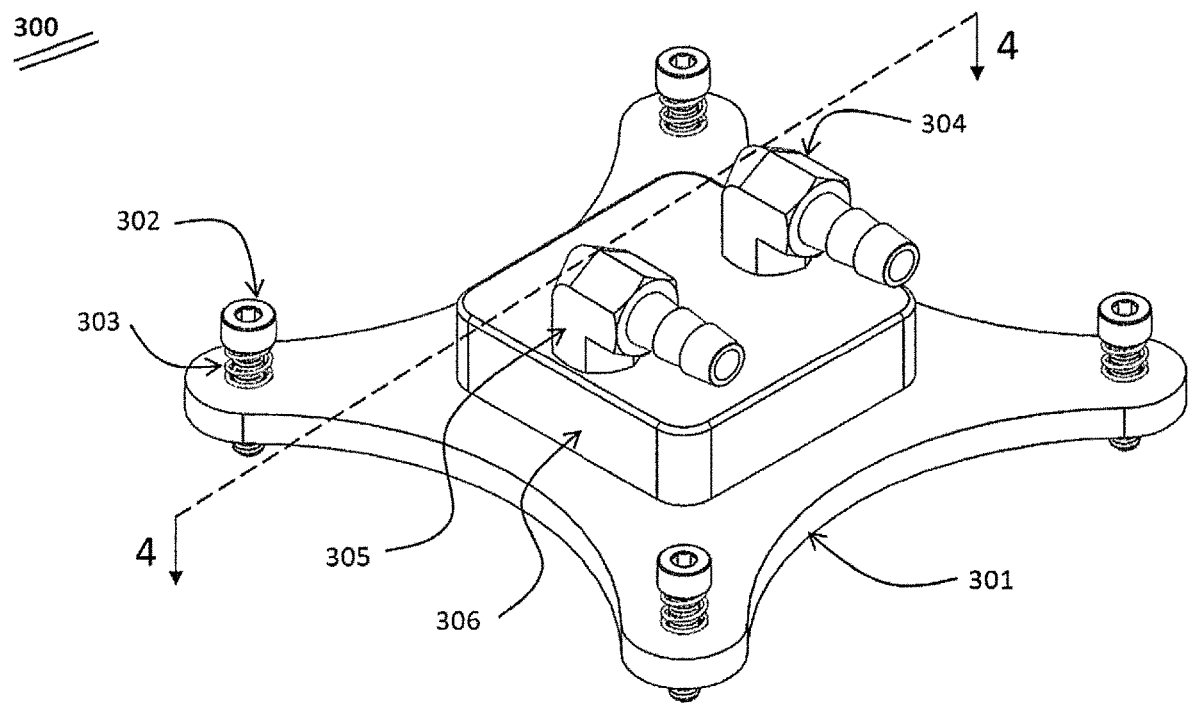
FIG. 3 shows an isometric view of one embodiment of a direct contact fluid based cooling module for delivering fluid to the surface of a CPU package.

FIG. 3 shows an isometric view of one possible embodiment of a direct contact fluid manifold for processors (300). The manifold is comprised of a center portion (306) which includes features for inlet and exit fluid plena (not shown due to viewing angle). Extending beyond the central fluid plena portion (306) is a mounting flange (301) whose size is designed to conform to existing accessory mount patterns. Such mount patterns may be, for example, 80 mm square bolt patterns. Fastening to the accessory mount patterns may be accomplished using mechanical fasteners (302) which may be, for example, mechanical screws, quarter turn fasteners, or bolts.

Other features may be included to aid the mechanical fastening of the fluid manifold to the circuit board. For example, compression springs (303) may be disposed between the mount plate and the fastener to provide a compressive pre-load between the fluid manifold and the processor package, without requiring bearing of the fastener head (302) against the fluid manifold flange (301). This may be useful to prevent over-stressing the processor package by over-torquing mechanical fasteners. Of course, other features may also be used including, for example, spacers, standoffs, shoulder screws, or binding barrels.

Because the cooling is accomplished through direct contact between the fluid and the device to be cooled, effective heat transfer can be achieved even with manifolds constructed from materials that are not thermally conductive. Modular, direct contact fluid manifolds may be built from a variety of materials including, for example, metals, ceramics, and plastics.

In operation, fluid is supplied to the fluid manifold by one or more fluid inlets (304), while the fluid is exhausted through one or more fluid outlets (305). Fluid inlets/outlets may be of any typical form including, for example, barbed fittings, quick disconnects, press-to-connect fittings, or tubing pigtails.

A single-phase fluid is administered to the fluid manifold. This fluid may be any suitable coolant, including air, water, ethylene glycol, propylene glycol, ethanol, R134A, ammonia, or any other fluid. A combination of two or more of these fluids may also be used.

Figure 4:
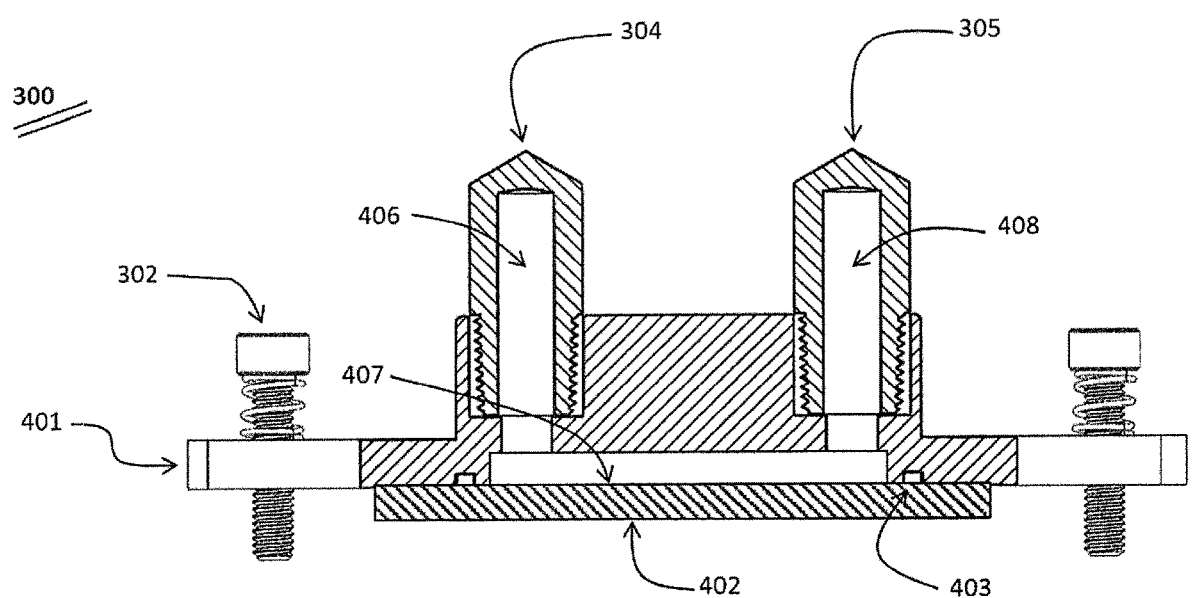
FIG. 4 shows a cross sectional view of one embodiment of a direct contact fluid based cooling module, where cooling fluid is delivered to contact a CPU package's exterior surface.

FIG. 4 shows a cross sectional view of a direct contact fluid manifold for processors (300). The manifold (401) brings cooling fluid in direct contact with the exterior surface (407) of the packaged processor (402). The manifold does not mechanically affix to the packaged processor (402). Instead, fasteners (302) mechanically affix the manifold to a circuit board (not shown). Fasteners (302) may be of many types as previously described. During the mechanical fastening, sealing features (403) (e.g., an o-ring) disposed on the manifold form a leak-free seal between the manifold (401) and the packaged processor (402).

Cooling fluid is supplied by an external source of pressurized fluid. Fluid enters the manifold through one or more inlet ports (304) and fills the inlet plenum (406). Fluid then travels to a reservoir in contact with a surface (407) on the packaged processor (402). This reservoir is bounded by some combination of the manifold (401), one or more surface (407) of the processor, and seals (403). At the surface (407) of the processor (402), heat is transferred from the processor to the fluid. Cooling fluid then exits the manifold by traversing the exit plenum (408) and exiting the manifold through one or more exit ports (305).

Figure 5:
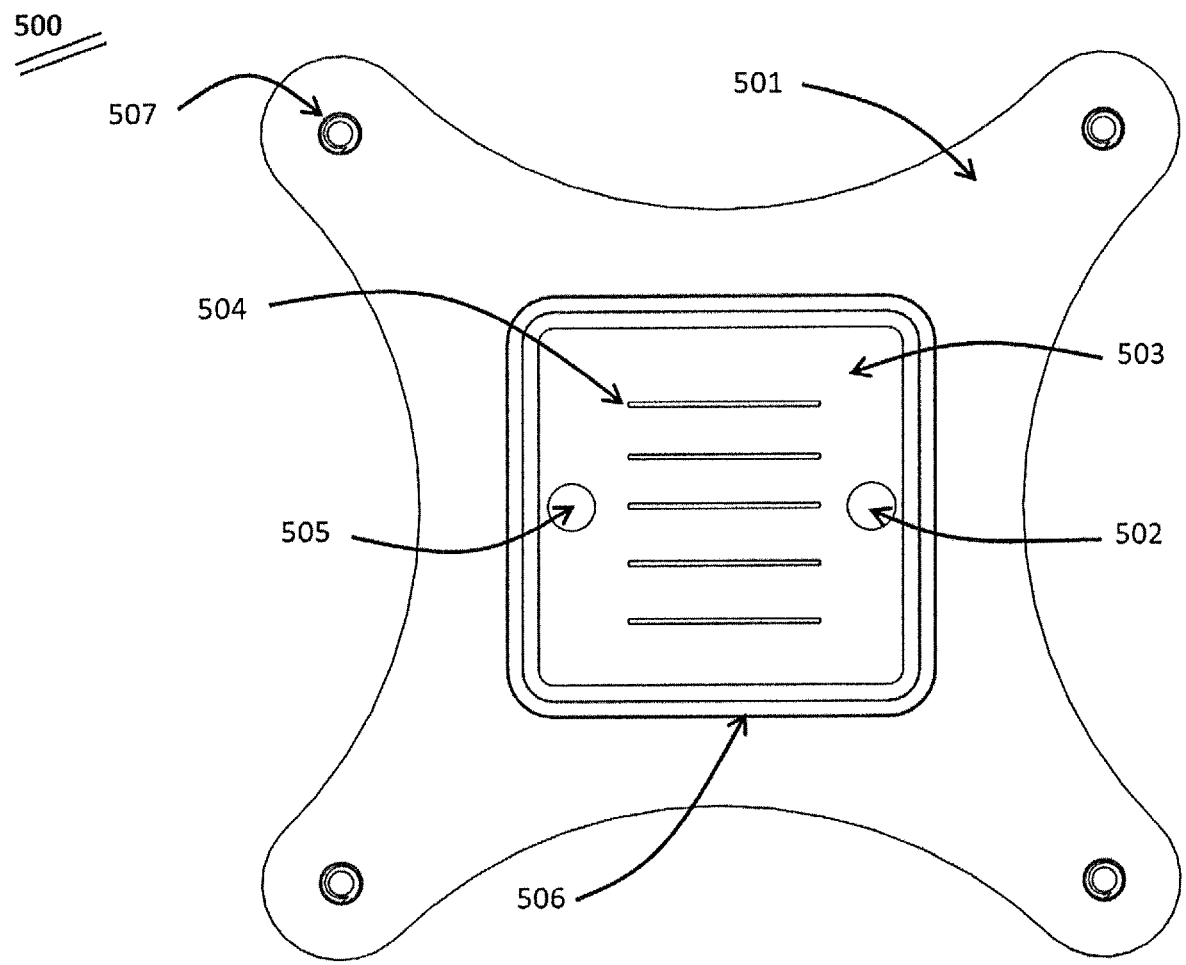
FIG. 5 shows a bottom view of one embodiment of a direct contact fluid based cooling module, where the fluid-filled cavity in contact with the CPU package may have cooling or flow enhancing features.

FIG. 5 shows a bottom view of one embodiment of a direct contact fluid manifold for processors (500). The bottom view illustrates a possible configuration of the areas wetted by the fluid. The manifold (501) includes fasteners (507) and a center portion (503) that is wetted by fluid. Fluid enters and fills the wetted portion (503) through one or more fluid inlets (502), and later exits through one or more exit ports (505). Between inlet (502) and exit (505), in the wetted portion (503) may also be disposed features for enhancing the heat transfer. Such features may be area enhancements including, for example, fins or ribs (504). One or more seals (506) is disposed on the lower surface of the manifold (501) to aid in creating a leak-free barrier between the wetted portions (503) and the exterior.

While the fluid path between the inlet and outlet have been shown as a continuous reservoir in FIG. 4, this disclosure is not limited to such configurations. For example, FIG. 6 illustrates another embodiment of the fluid manifold with modular mounts for processors, where the fluid inlet and outlet are not in communication through the manifold.

Figure 6:
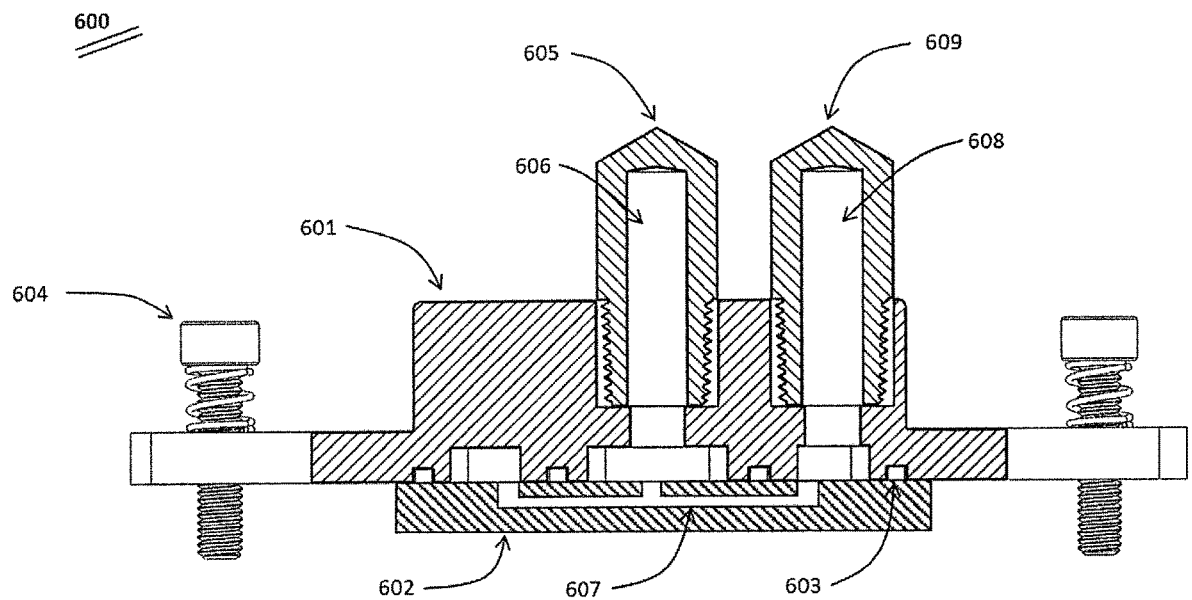
FIG. 6 shows a cross sectional view of another embodiment of the direct contact fluid based cooling module, where fluid is supplied to the CPU package for delivery within the CPU package.

As shown in FIG. 6, with assembly (600) the manifold (601) may be disposed on a processor package (602) that includes internal flow channels (607) for the purpose of better cooling. Fluid enters the assembly (600) through one or more inlet ports (605) and fills an inlet plenum (606). Here, however, the fluid in the inlet plenum (606) and the outlet plenum (608) are not in direct communication through the manifold (601). Instead, the fluid is passed through flow channels (607) within the interior of the processor package (602). This allows fluid to move between the inlet plenum (606) and the outlet plenum (608) before exiting through one or more exit ports (609). Seals (603) now serve to separate inlet fluid from outlet fluid, and from leaking to the exterior of the overall assembly. Notably, the manifold (601) is still mechanically affixed to a circuit board or other substrate (not shown) by fasteners (604) outside the extent of the processor (602), and not directly fastened to the processor. However, leak-free seals (603) are formed between the manifold (601) and the processor (602).

Figure 7:
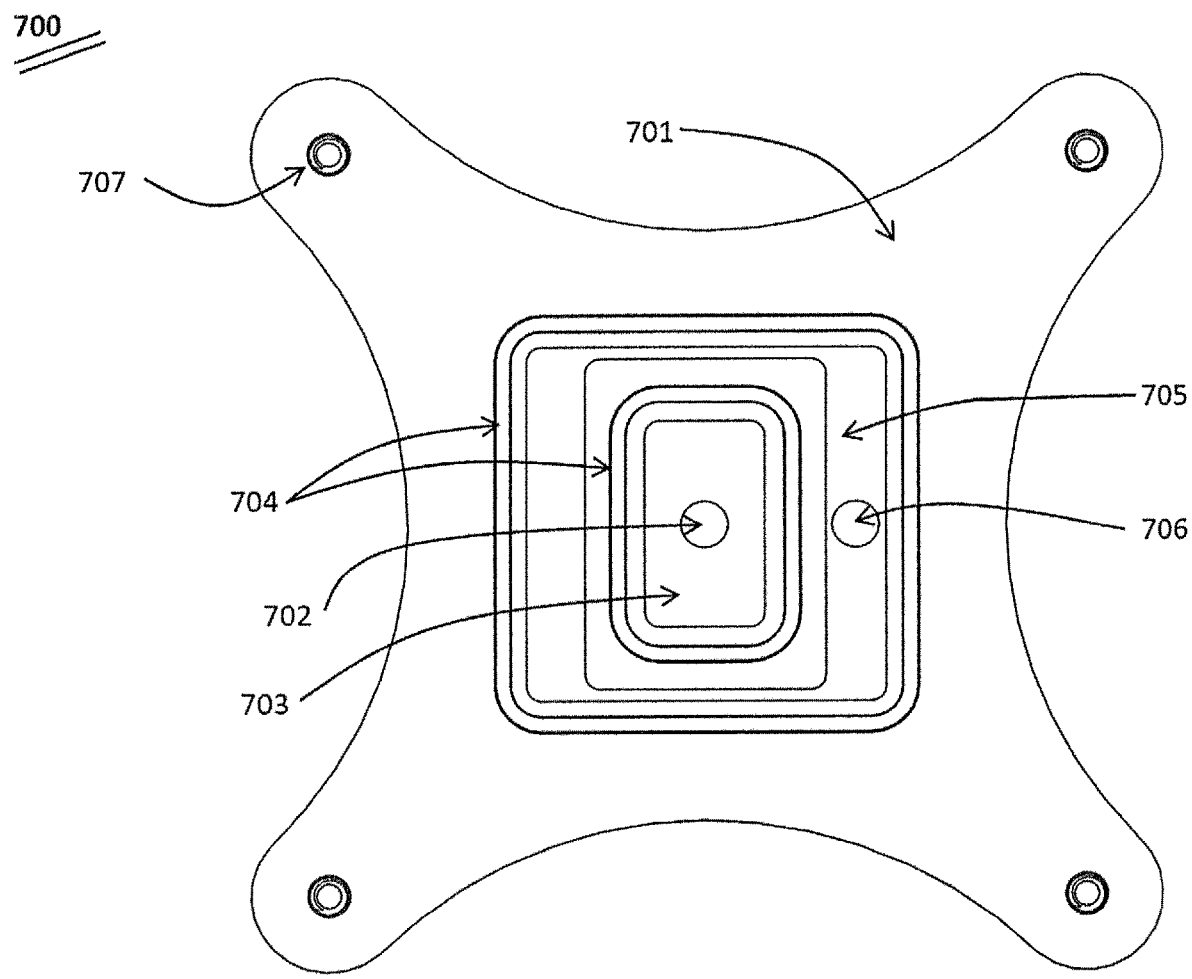
FIG. 7 shows a bottom view of one embodiment of a direct contact fluid based cooling module for processors, where the supply/receive reservoirs are separate to provide/receive coolant fluid to/from the CPU package.

FIG. 7 shows a bottom view of one embodiment of a direct contact fluid manifold for processors (700). Fluid enters the manifold (701) through one or more inlet ports (702), filling the inlet plenum (703). This inlet plenum (703) is a wetted surface and is in communication with a surface of the processor, which would also be wetted by fluid.

Seals (704) form a barrier between the inlet plenum (703) and the outlet plenum (705). To traverse between the inlet plenum (703) and the outlet plenum (705), the fluid passes through flow channels or conduits within the processor package, for example the channels (607) shown in FIG. 6. After passing through the interior of the processor package and being returned to the manifold, fluid fills the outlet plenum (705) and exits the manifold through one or more exit ports (706). Seals (704) also create a leak-free barrier between the outlet plenum (705) and the exterior of the assembly. Fasteners (707) affix the manifold (701) to the assembly, but outside the extents of the processor.

Figure 8:
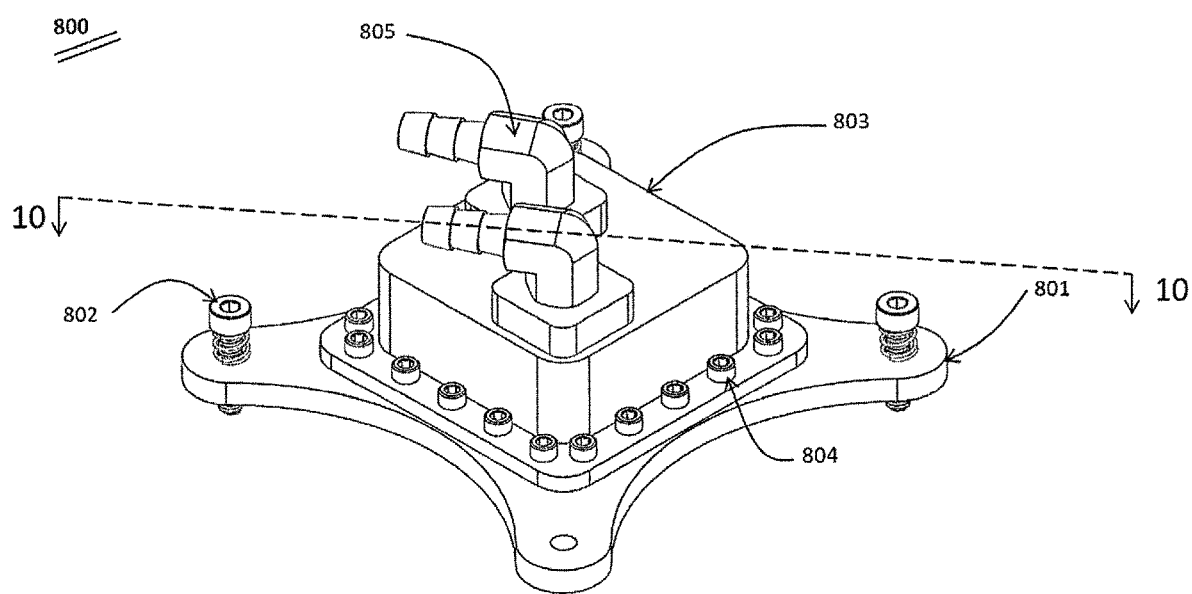
FIG. 8 shows an isometric view of another embodiment of a direct contact fluid based cooling module which contains internal features to produce high performance microjet cooling on the exterior surface of a CPU package.

The direct contact fluid manifold does not have to be a monolithic part. Assemblies may allow for the addition of heat transfer enhancing features to be included within the manifold. Such heat transfer enhancing features may include, for example, microjet cooling. FIG. 8 illustrates a multiple-part direct contact fluid module assembly with internal microjet cooling features (800).

The multiple-part assembly (800) of FIG. 8 is comprised of a microjet mount plate (801), a reservoir cap (803), inlet and exit ports (805), and mechanical fasteners (802) to affix to the circuit board's accessory mounts. Fasteners (804) may also be used to attach different parts within the assembly (800).

Figure 9:
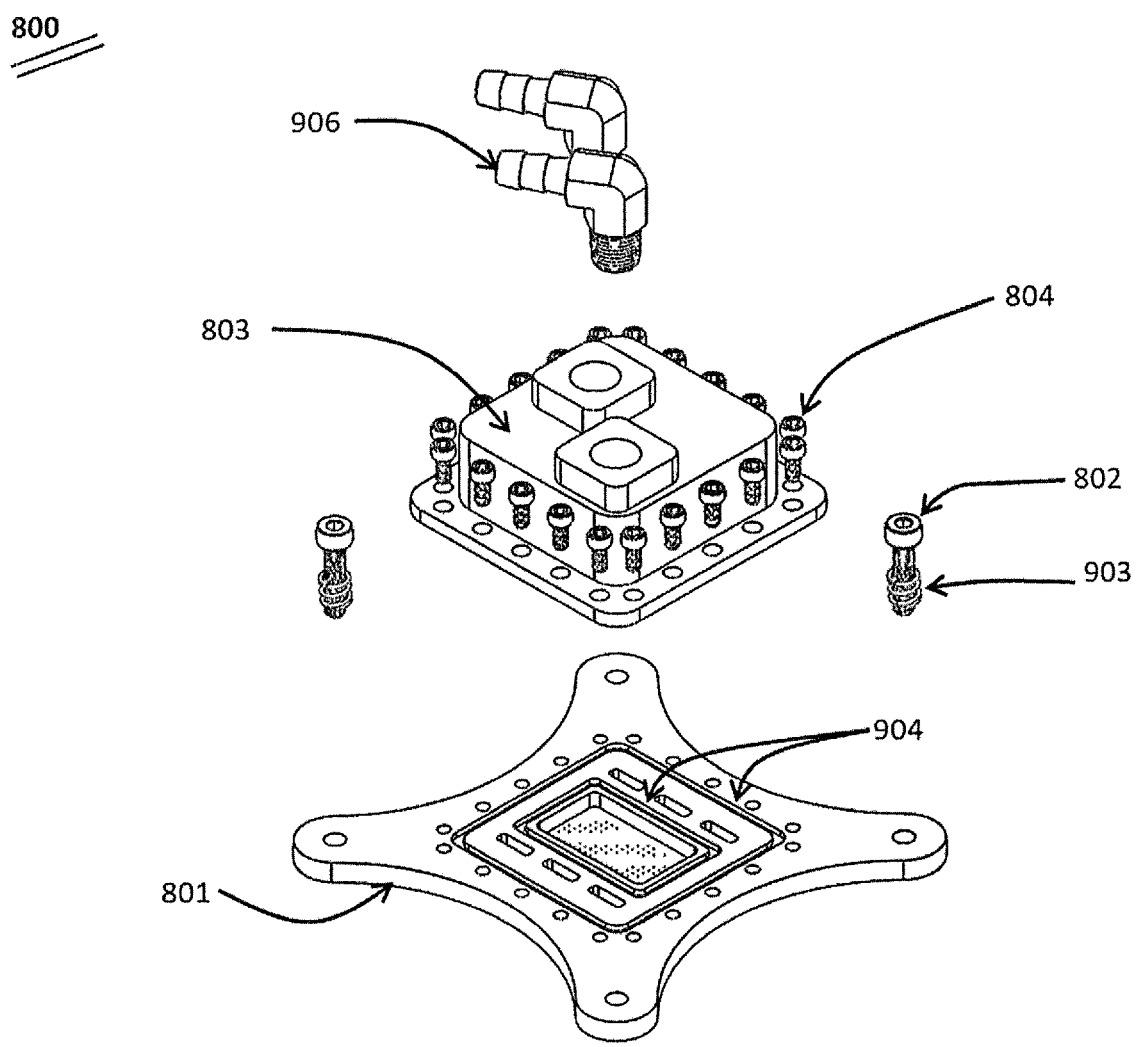
FIG. 9 shows an exploded view of one embodiment of a direct contact fluid based cooling module which contains internal features to produce high performance microjet cooling on the exterior surface of a CPU package.

FIG. 9 depicts an exploded view of the fluid module assembly (800) such as that discussed in FIG. 8. A microjet mount plate (801) forms the primary mounting interface with the circuit board, for example, by bolts (802) which may have pre-loading components (903). A reservoir cap (803) creates a distinct inlet plenum and a distinct outlet plenum in communication with the microjet mount plate (801). The reservoir cap (803) and microjet mount plate (801) may be attached, for example, by fasteners (804). Fluid fittings (906) may be used for fluid conveyance into and out of the assembly. Gaskets (904) are used for establishing fluidic seals.

Figure 10:
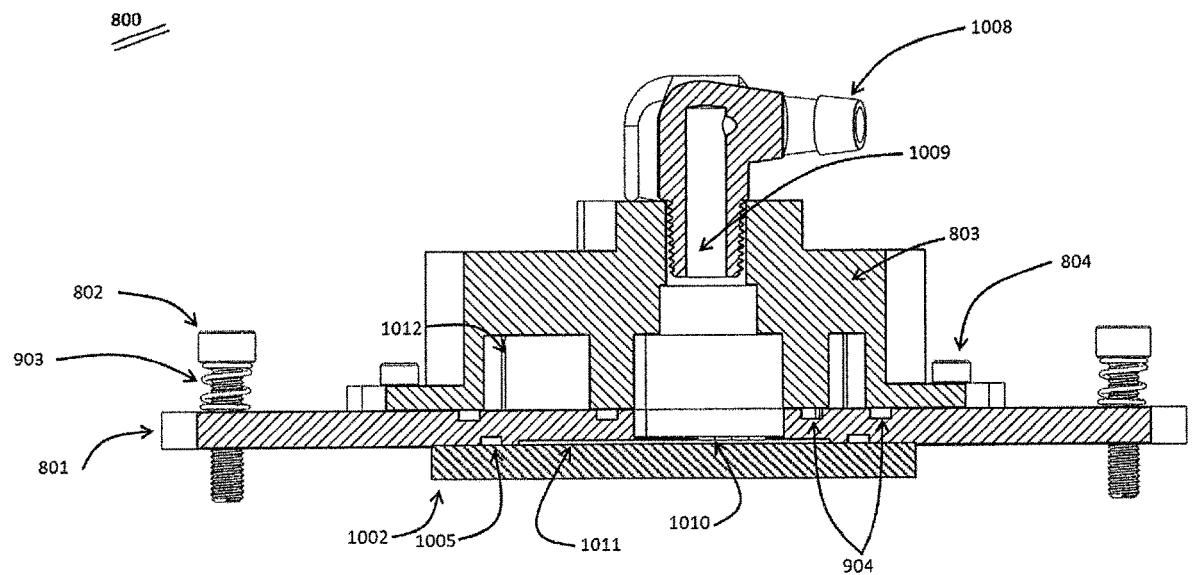
FIG. 10 shows a cross sectional view of one embodiment of a direct contact fluid based cooling module with microjet cooling of the exterior surface of a CPU package.

FIG. 10 shows a cross sectional view of one embodiment of a direct contact fluid module for processors (800). This embodiment features a multiple-part assembly that is also configured with direct contact microjet cooling of the processor.

A microjet mount plate (801) forms part of the assembly along with a reservoir cap (803). The microjet mount plate and reservoir cap may be attached, for example, with mechanical fasteners (804). At least two internal volumes are formed by the reservoir cap and the microjet mount plate. At least one internal volume is filled with fluid from an inlet (1008). This inlet plenum (1009) contains higher-pressure inlet fluid. A microjet nozzle plate (1010) separates the higher-pressure inlet plenum (1009) from a lower-pressure outlet plenum (1012). The microjet nozzle plate (1010) is comprised of one or more orifices. The size of these orifices is carefully designed to balance pressure drop with heat transfer performance but may be, for example, 200 micrometers in diameter. The orifices may be circular in cross section or may be other shapes.

As fluid passes through the microjet nozzle plate (1010), the cooling fluid forms microjets directed at the surface (1011) of the packaged processor (1002). Fluid strikes the heat transfer surface (1011) of the packaged processor and fills the outlet plenum (1012). During this impingement, heat is transferred from the processor to the fluid. This process provides direct contact between the cooling fluid and an outer surface of the processor package. This approach eliminates the need for thermally conductive greases, a smooth heat transfer surface, and any additional conductive layers.

Seals (1005 and 904) are disposed on and within the fluid module assembly. These seals separate inlet from outlet fluid and serve to create a leak-free barrier between fluid contained within the fluid module and the exterior. Seals may be of several types, including O-rings, gaskets, or elastomeric compounds. In this embodiment, the fluid directly contacts the surface of the processor package (1002) but does not penetrate within the processor package, as it may in other embodiments.

In all embodiments, the microjet mount plate (801) is affixed outside the extents of the processor (1002). Such installation may be by bolts (802) with pre-loading elements (903) or by other techniques. Mechanical fastening may be done to a printed circuit board, for example, to the board's accessory mounts. In all embodiments, the microjet mount plate (801) does not mechanically fasten to the processor package (1002) but does form a leak-free seal against at least one surface (1011) of the processor package (1002).

Figure 11:
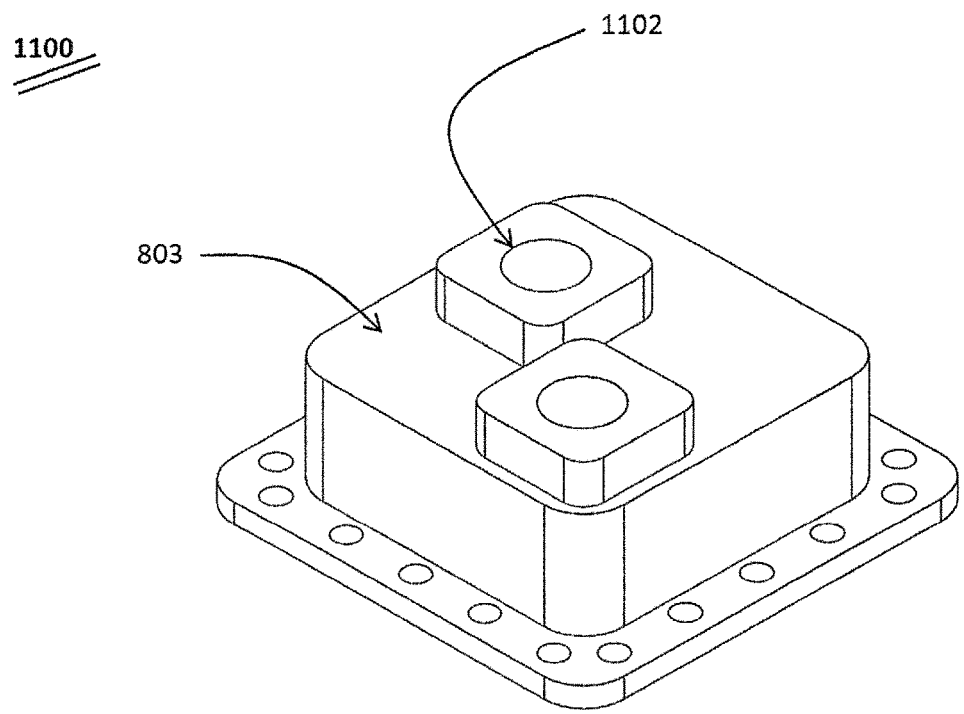
FIG. 11 shows a reservoir cap that may comprise one segment of a direct contact fluid based cooling module for processors.

FIG. 11 illustrates an isometric view of one possible assembly (1100) comprising a reservoir cap (803) that may be used in a multiple-part fluid module assembly. Within the reservoir cap (803) are formed at least two separate fluid plena. In the minimal case, these plena would act as part of an inlet plenum and an outlet plenum. Means of fluid ingress and egress may also be included on the cap, for example fluid ports (1102) for fittings, tubes, or other adapters.

Figure 12:
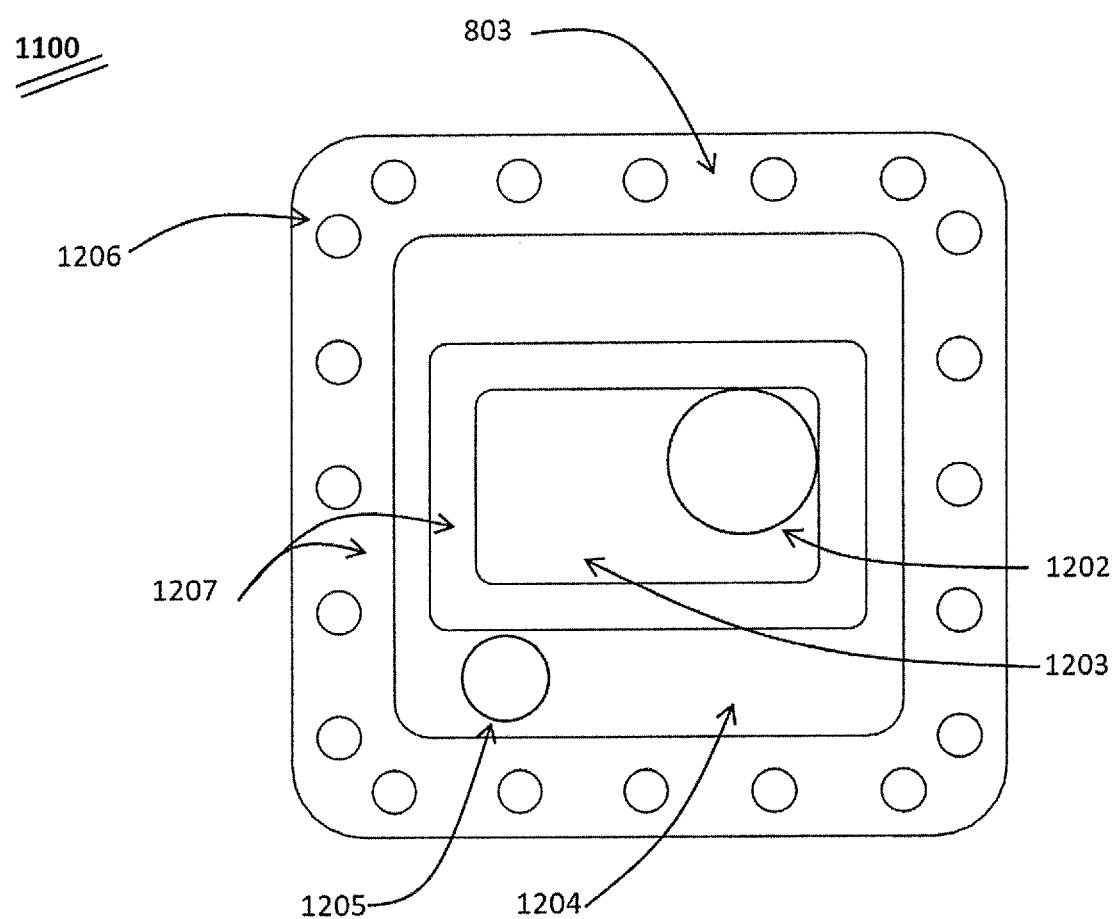
FIG. 12 shows a bottom view of the reservoir cap of FIG. 11, illustrating the separate inlet and outlet fluid reservoir sections.

FIG. 12 shows a bottom view of an example of an assembly (1100) comprising a reservoir cap (803). At least two plena (1203, 1204) are formed within the reservoir cap. Inlet fluid, for example, may enter through inlet port (1202) and fill the inlet plenum (1203). After passing through the microjet nozzle plate, the fluid fills an outlet plenum (1204) before being exhausted through one or more exit ports (1205). The reservoir cap (803) may be affixed to the microjet mount plate through a fastener pattern (1206). Seals are formed on sealing surfaces (1207) using gaskets (904).

Figure 13:
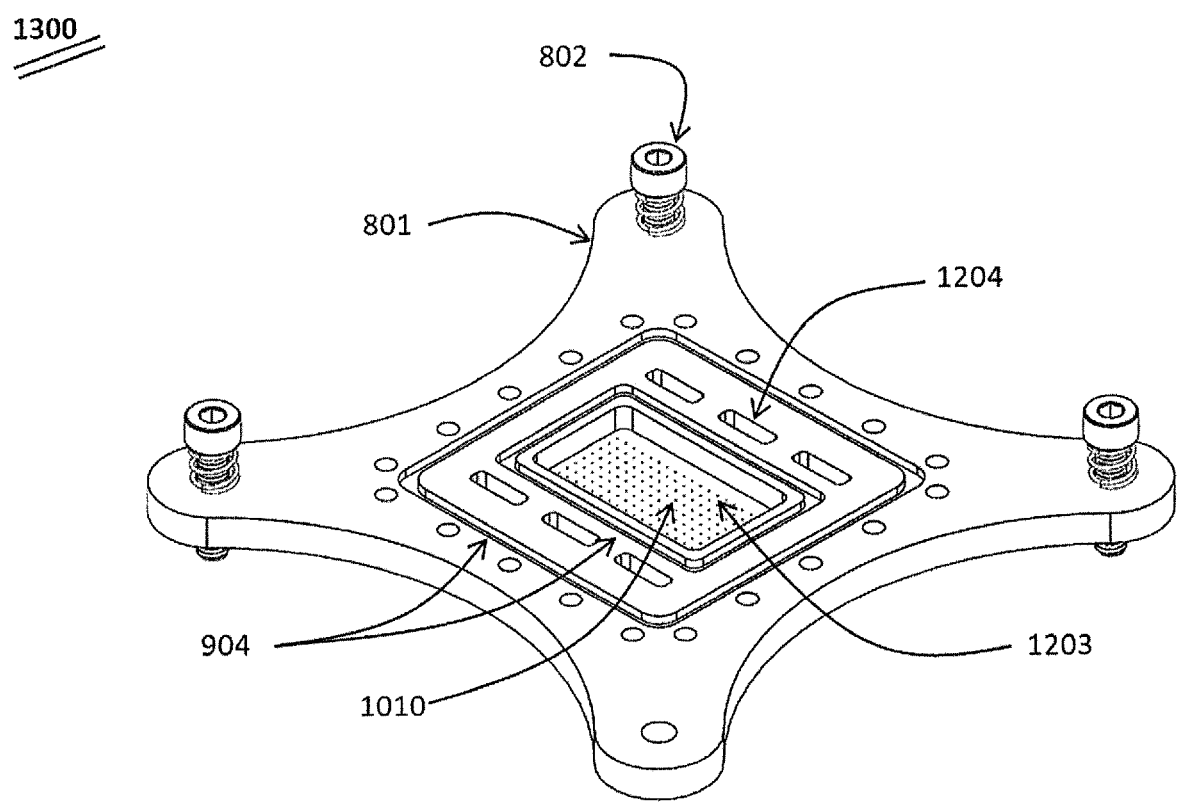
FIG. 13 shows an isometric view of a microjet mounting plate that may comprise one segment of a direct contact fluid based cooling module for processors.

FIG. 13 shows an isometric view of one example of an assembly (1300) comprising a microjet mount plate (801). Assembly (1300) is one part of a direct contact fluid module for processors. The fluid module may include a microjet mount plate (801) to increase the heat transfer performance of the assembly. The microjet mount plate (801) may include features, such as mechanical fasteners (802), that affix the fluid module to the circuit board or other assembly fixture.

Within the extent of the microjet mount plate (801) exists an inlet plenum (1203), which may be supplied fluid from, for example, the reservoir cap (803). The inlet plenum (1203) contains higher-pressure fluid. One or more orifices on a microjet nozzle plate (1303) separate the inlet plenum from the outlet plenum. These orifices form the fluid microjets to produce direct contact fluid cooling on the processor located in proximity to the fluid module. After the transfer of heat to the microjet fluid, the fluid traverses the outlet plenum (1204). Seals (1005) create a leak-free barrier between the microjet mount plate and the adjacent processor surface.

Figure 14:
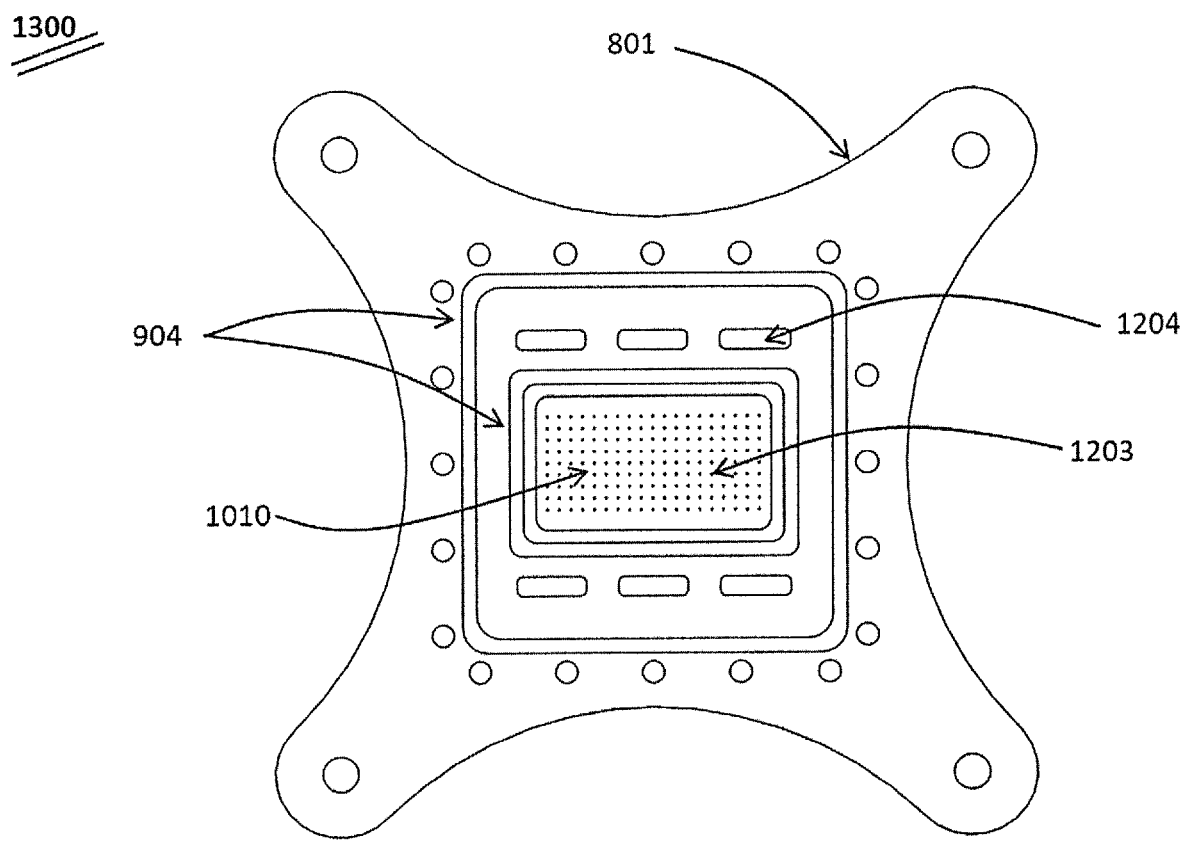
FIG. 14 shows a top view of a microjet mounting plate with microjet cooling features.

FIG. 14 shows a top view of a microjet mount plate instantiation (1300). Fluid may be supplied from a reservoir cap (803), forming at least two plena. An inlet plenum (1203) directs fluid through a microjet nozzle plate (1010), forming microjets that strike a surface of a processor package (1011) disposed beneath the microjet mount plate (801). During this process, heat is transferred to the fluid, which is then routed back up into one or more outlet plenum (1204).

Seals (904) separate the inlet plenum (1203) from the outlet plenum (1204) and form a leak-free seal to the exterior. Multiple seals may be used, as shown in FIG. 14.

Figure 15:
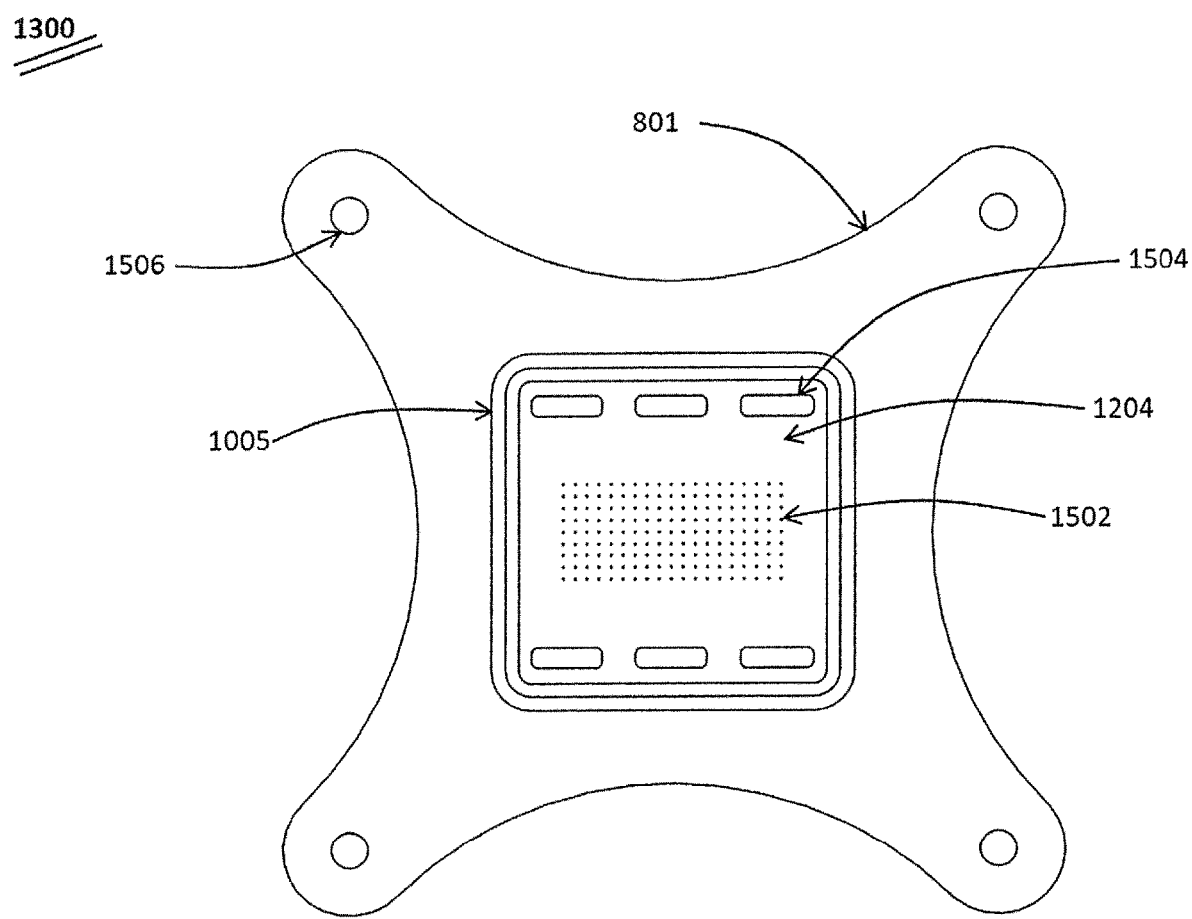
FIG. 15 shows a bottom view of a microjet mounting plate with microjet cooling features.

In FIG. 15, the lower surface of microjet mount plate (801) is shown, in one embodiment of a fluid module with integral microjet cooling (1300). This lower surface is the surface in proximity to the processor being cooled. Fluid passes through the microjet mount plate (801) by way of one or more microjet nozzles (1502) and fills the outlet plenum (1204). Fluid issuing from these nozzles impinges upon the direct contact surface of the processor, transferring heat and cooling the electronic device. This fluid then traverses the outlet plenum, moving through the microjet mount plate through outlet plenum passages (1504). The entire interior volume (that is, outlet plenum 1204) is wetted with cooling fluid in direct contact with a surface of the processor package. The microjet mount plate is affixed to a circuit board, for example, by a mechanical fastener pattern (1506) outside the extents of the processor. The microjet mount plate forms a leak-free seal using gaskets (1005) against the surface of the processor package but does not mechanically affix to the surface of the processor package.

FIG. 16 shows how the module depicted in FIGS. 9-15 would integrate into an assembly (1600) from an exploded isometric view. A heat generating element (1002), such as a computer processor, is disposed on a surface (1602), which may be the surface of a PCB or motherboard. Direct fluid contact cooling module (800) is attached to attachment features (1603), which are separate from the heat generating element (1002), via an attachment mechanism (802) such as pre-loaded fasteners. In operation, cooling fluid enters through inlet (1008), passes through the direct contact cooling module (800) to directly contact heat generating element (1002), and is exhausted through the outlet (1608). Fluid is contained between the direct contact cooling module (800) and heat generating element (1002) via a seal disposed on the underside of the direct contact cooling module (800) (obscured in image).

FIGS. 17-20 depict another embodiment of a direct contact cooling module. FIG. 17A shows an isometric view and FIG. 17B a bottom view of a cooling housing (1701) forming part of a direct contact cooling module (2001). Cooling housing (1701) consists of an inlet port (1702) and an outlet port (1703), and a sealing lip (1704) to be used along with clamping plate (1901) (FIG. 19) in transmitting force to create a fluid tight seal. The cooling housing (1704) has microjet nozzles (1705), in fluid communication with inlet port (1702), and outlet plenum passages (1706), in fluid communication with outlet port (1703).

Figure 18:
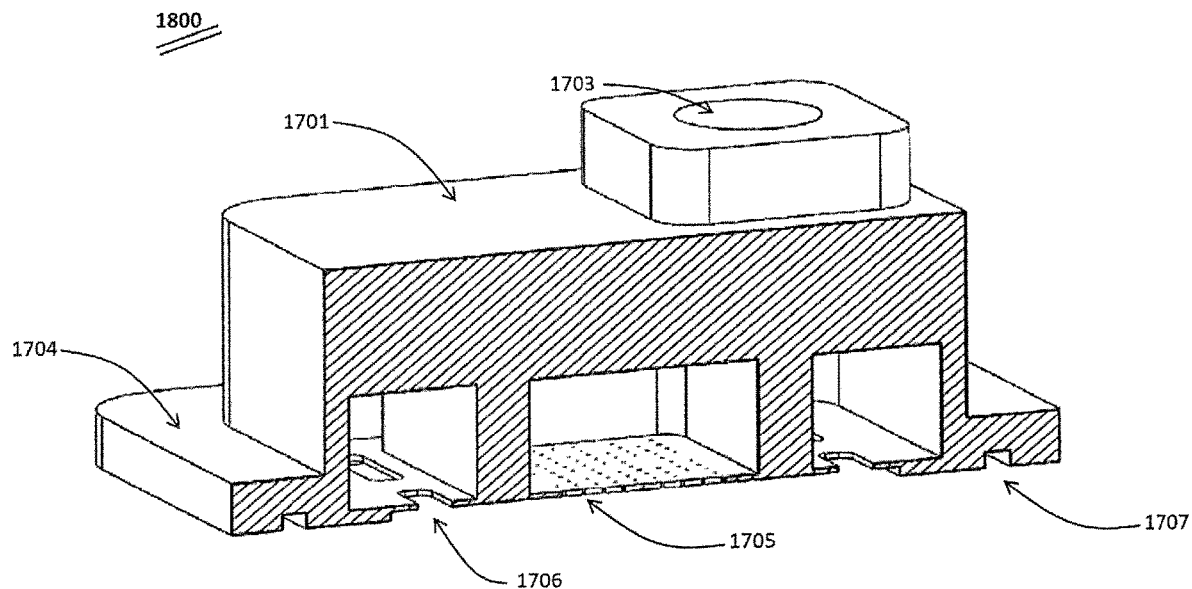
FIG. 18 shows a cross sectional view taken along line 18-18, FIG. 17A, of a reservoir cap in an alternative microjet direct contact fluid module embodiment.
Figure 20:
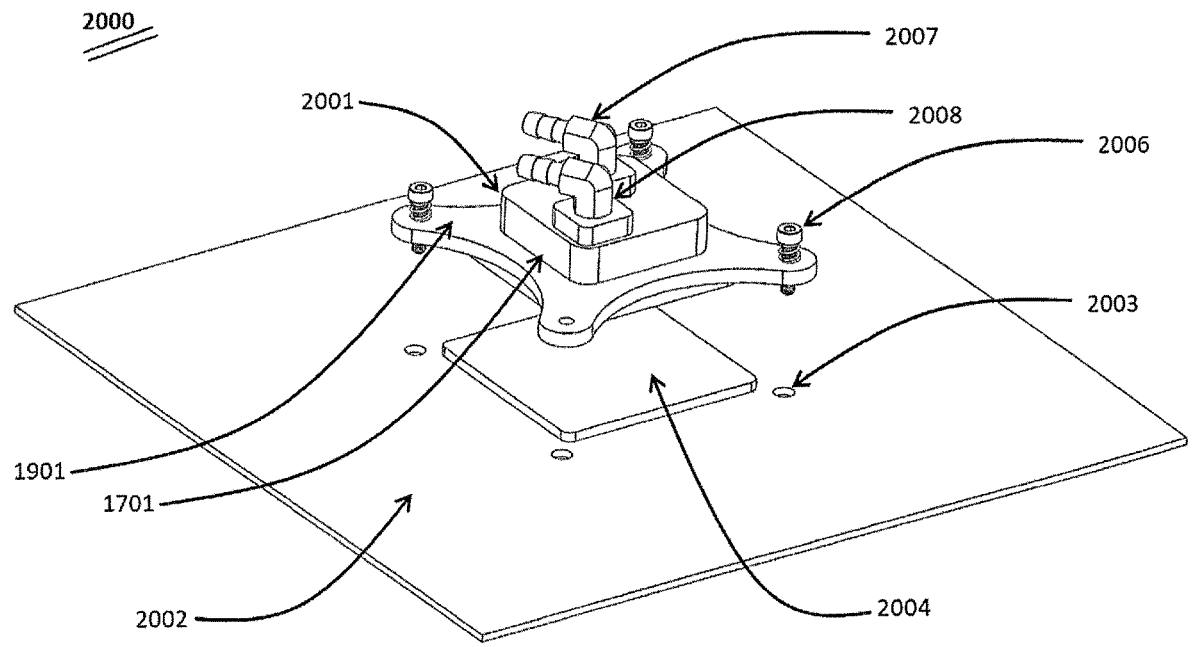
FIG. 20 shows an isometric exploded assembly view of an alternative embodiment.

FIG. 18 shows a partial isometric cross sectional view (1800) of the cooling housing (1701). In operation, an inlet port (1702) (obscured by cross section) is in fluid communication with microjet nozzles 1705, through which fluid passes to impact the surface of a heat generating electronic component (2004) (FIG. 20). Fluid is exhausted through outlet plenum passages (1706) in fluid communication with the outlet port (1703). A sealing mechanism (1707), for example a gasket, o-ring, adhesive, or other, is disposed on the lower surface of the cooling housing (1701) to form a seal against the surface of a heat generating electronic component (2004). A sealing lip (1704) is present to accept a force if needed, for example via clamping plate (1901), in administering the sealing mechanism (1707).

Figure 19:
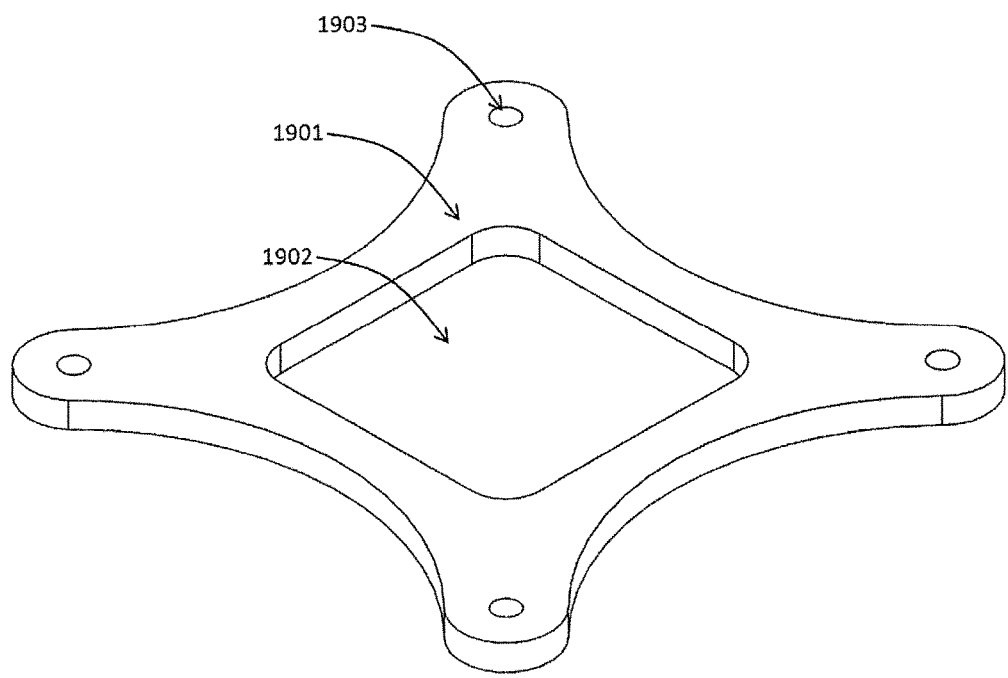
FIG. 19 shows an isometric view of a clamping plate used in an alternative embodiment to attach to the mounting pattern and create a seal.

FIG. 19 shows an embodiment of a clamping plate forming part of direct contact cooling module (2001). The clamping plate (1901) has a cutout (1902) meant to fit around a cooling housing (1701) so that the clamping plate (1901) can mate with cooling housing lip (1704). Clamping plate (1901) has at least one mechanism (1903) to accept a fastener or other attachment feature (2006).

FIG. 20 shows how the direct contact cooling module (2001), comprised of a cooling housing (1701) and a clamping plate (1901) as depicted in FIGS. 17-19, would integrate into an assembly (2000) with an exploded isometric view. A heat generating element (2004), such as a computer processor, is disposed on a surface (2002), which may be the surface of a PCB or motherboard. Direct fluid contact cooling module (2001) is attached to attachment features (2003), which are separate from the heat generating element (2004), via an attachment mechanism (2006) such as preloaded fasteners. In operation, cooling fluid enters through inlet (2007), passes through the direct contact cooling module (2001) to directly contact heat generating element (2004), and is exhausted through the outlet (2008). Fluid is contained between the direct contact cooling module 2001 and heat generating element (1604) via a seal (1707) disposed on the underside of the cooling housing (1701) (obscured in image).

Direct contact cooling modules (1601) and (2001) are example embodiments, of which the present invention is not limited to specific features or forms described. There may be direct contact cooling modules containing different methods of: forming the fluidic seal, attaching to the PCB or substrate, administering fluid onto the heat generating component, forming direct contact cooling modules, administering fluid in and out of the direct contact cooling module, establishing fluid communication within different parts of the direct contact cooling module, and others.

Direct contact fluid modules may be of multiple pieces, or may be of a single unitary structure. Seals may be formed via o-rings, gaskets, adhesives, soldering, brazing, welding, or other permanent and non-permanent sealing mechanisms. PCB attachment may be done via fasteners, brackets, clamps, threaded rods and wingnuts, rivets, or other attachment mechanisms. Fluid may be administered directly onto the device surface to which the seal is made in a variety of different ways, including external contact of the surface, penetration into the surface, passing through the surface entirely, or other fluid disposing mechanisms to accomplish cooling. Fluidic supply and exhaust may be accomplished by way of fluid fittings, fluid conduits, direct tube attachment, an accompanying fluid manifold, or other fluid delivery techniques. There may be different layouts of inlet passageways and outlet passageways to deliver and exhaust fluid from the surface of the heat generating device, such as microjet nozzles, large non-restrictive inlet passageways, circular exit passageways, non-circular exit passageways, single exit passageways, a plurality of exit passageways, and other fluidic passageway configurations. Differences are not limited to those listed, and will be apparent to those skilled in the art without departing from the scope of the present invention.

In certain embodiments, the microjet nozzles may be disposed in arrays so as to provide cooling for electronic devices of a range of different sizes. Such devices may contain length scales that range from 5-50 mm, for example. Therefore, the size, location, and distribution of nozzles are carefully chosen to provide adequate cooling of the entire device. The nozzles may be disposed in linear arrays, circular arrays, or any other pattern that serves to help cover the surface of the heat-generating devices. The nozzles may be far apart or close together, details of which are carefully chosen in balancing thermofluidic considerations such as, for example, heat transfer and pressure drop.

In certain electronic devices, the heat may not be generated uniformly across the device surface to be cooled. Such sections of the surface where more heat is being generated are therefore more prone to increases in temperature, sometimes referred to as "hot spots". In these cases, it may be advantageous to concentrate nozzles nearer to the hot spots of higher heat generation, while having more sparsity in the array where there is lower or no heat generation. This allows for improved cooling efficiency, as better cooling occurs using the same amount of fluid flow, compared to a case where nozzles are uniformly disposed on the nozzle plate.

In addition to the distribution of nozzles, the size and shape of each individual nozzle may vary across the array to balance tradeoffs of, for example, pressure, flow rate, and heat transfer, with the heat generating character of the electronic device. For example, a set of jets with lower heat transfer capability may be administered around areas of low heat generation, while jets with high heat transfer capability may be administered near hot spots.

Figure 21A:
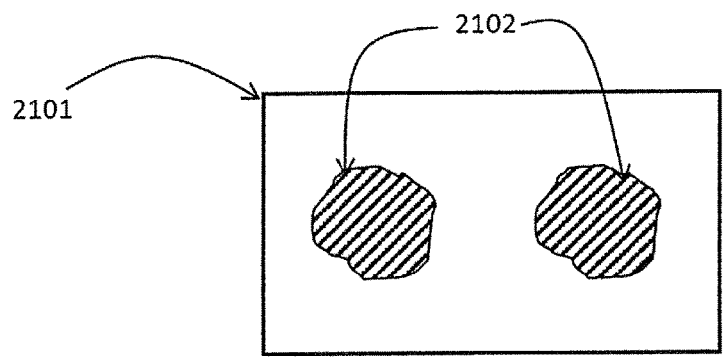
FIGS. 21A and 21B show how embodiments of the direct contact fluid module containing microjets may be distributed so as to provide non-uniform cooling.
Figure 21B:
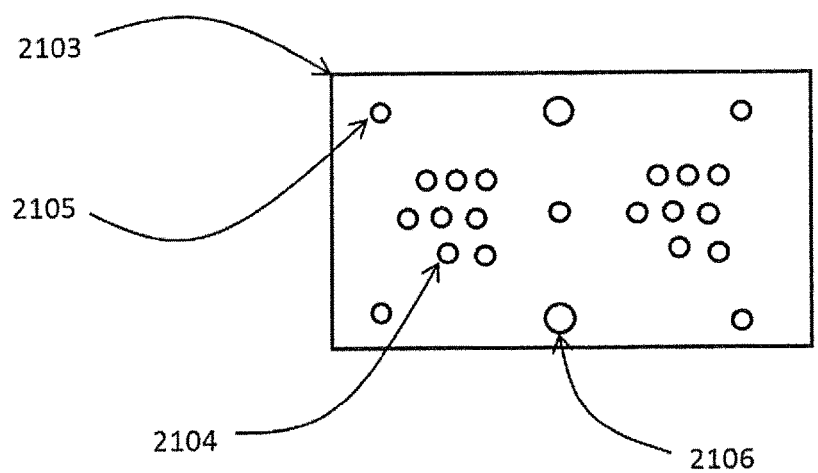

FIGS. 21A and 21B illustrate one possible implementation for matching hot spots on the device with the microjet-cooled direct contact fluid module. The heat generating device (2101) FIG. 21A may have one or more areas (2102) within it that are higher heat dissipation than the rest of the device. The microjet nozzle plate (2103) FIG. 21B may have an array of nozzles for cooling the device (2101). It may be beneficial to have a non-uniform distribution of nozzles, where nozzles may be arranged in a non-uniform way (2104) to provide better cooling to device hot spots (2102). In other areas, nozzle distribution may, for example, be more sparse (2105) where there is lower heat load, or they may be shaped or sized differently (2106). These non-uniform arrangements may produce more uniform temperatures on the device. This reduces the presence of thermal gradients across devices with non-uniform heat dissipations.

Figure 22A:
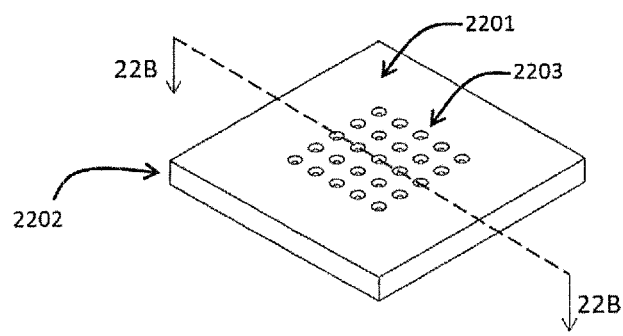
FIGS. 22A and 22B show how embodiments of the direct contact fluid module containing microjets may be configured to have chamfers for improved fluid performance, where
Figure 22B:
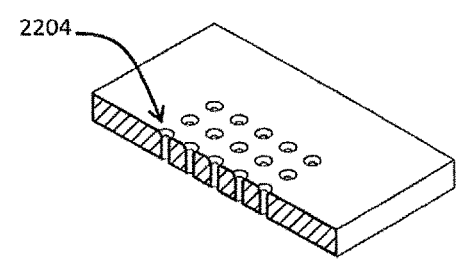

In these and other embodiments, the shape of the nozzle specifically can be carefully chosen to optimize thermofluidic properties, such as pressure drop, flow rate, and heat transfer capability. FIGS. 22A and 22B show one embodiment, where a jet nozzle plate (2201) of thickness (2202) has an array of microjet nozzles (2203). By taking a cross section of the nozzle plate (2201), as in FIG. 22B, the nozzle shape becomes visible. By including a chamfered edge (2204) on the jet nozzles (2203), enhanced fluid flow can result by reducing pressure drop with minimal impact on fluid flow and heat transfer. Note that the geometric features of the chamfer such as angle, depth, and diameter are chosen to produce an optimal desired result.

As part of this disclosure, a fluid module provides direct fluid contact cooling of processors. The fluid module features mounts that are configured to avoid mechanical fastening to the processor package while still forming a leak-free seal with a surface on the processor package. Mechanical fastening is done outside the extents of the processor, for example with existing circuit board mounts. This approach provides direct contact fluid cooling, minimizes mechanical stress on the processor package, and leverages common printed circuit board accessory mounting features. The direct contact fluid module reduces the thermal path for heat that is generated by the processor, using the processor's own surface or surfaces as the heat transfer interface. Direct contact fluid modules are designed to be used with many commonly available processor packages on printed circuit boards with accessory mounting patterns.

In one embodiment, the present disclosure discusses a method of thermal management of computer processors by direct fluid-contact cooling. First, the fluid module is disposed over a computer processor. The module attachment produces a leak-free seal between the module and a surface of the processor but does not mechanically fasten to the processor. Coolant fluid passes within the module, making direct contact with at least one surface of the processor. In certain embodiments, fluid contact with the processor may be in the form of impinging microjets formed by the module. In certain other embodiments, fluid contact may not be limited to an external processor surface, but may occur with coolant flowing through passages within the processor. In every embodiment, heat is transferred from the processor to the fluid making direct contact with the surface(s) of the packaged processor. The fluid then exits the module.

The present disclosure is not to be limited in scope by the specific embodiments described herein. Indeed, other various embodiments of and modifications to the present disclosure, in addition to those described herein, will be apparent to those or ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A direct-contact single-phase fluid-based cooling module for fluidly cooling an electronic component that is mounted to a printed circuit board (PCB), the cooling module comprising:
   a manifold comprising a fluid inlet that is fluidly coupled to a fluid outlet, wherein the manifold is configured to be removably coupled to the PCB;
   manifold mounting structures that are configured to removably couple the manifold to the PCB; and
   a separable fluid-tight seal between the manifold and a surface of the electronic component;
   wherein when a fluid is passed through the manifold the fluid directly contacts the surface of the electronic component.

2. The direct-contact fluid-based cooling module of claim 1, wherein the manifold mounting structures are located outside the extent of the electronic component to be cooled.

3. The direct-contact fluid-based cooling module of claim 1, wherein fluid contacts only exterior surfaces of the electronic component.

4. The direct-contact fluid-based cooling module of claim 1, wherein the fluid passes from the inlet, within the electronic component, and to the outlet, for purposes of better heat transfer.

5. The direct-contact fluid-based cooling module of claim 1, wherein the manifold mounting structures are configured to fix the manifold to the printed circuit board.

6. The direct-contact fluid-based cooling module of claim 5, wherein the manifold mounting structures are configured to fix the manifold to a processor accessory mount pattern of the printed circuit board.

7. The direct-contact fluid-based cooling module of claim 1, wherein the manifold mounting structures comprise a pre-loading component to produce a seal on the electronic component.

8. The direct-contact fluid-based cooling module of claim 1, further comprising a compressible sealing element between the manifold and the electronic component, to facilitate the fluid-tight seal.

9. The direct-contact fluid-based cooling module of claim 1, wherein the manifold further comprises a fluid plenum that fluidly couples the inlet and the outlet, and wherein fluid in the plenum contacts the surface of the electronic component.

10. The direct-contact fluid-based cooling module of claim 9, wherein the manifold further comprises a nozzle plate that defines a plurality of orifices that are configured to create jets that are directed at the surface of the electronic component.

11. The direct-contact fluid-based cooling module of claim 10, wherein the nozzle plate divides the fluid plenum into an inlet plenum and an outlet plenum, wherein the fluid pressure is lower in the outlet plenum than it is in the inlet plenum.

12. The direct-contact fluid-based cooling module of claim 11, wherein the manifold further defines at least one outlet fluid passageway that is configured to conduct fluid from the outlet plenum toward the fluid outlet of the manifold.

13. The direct-contact fluid-based cooling module of claim 12, wherein a perimeter can be drawn around the plurality of orifices without enclosing any of the outlet fluid passageways.

14. The direct-contact fluid-based cooling module of claim 10, wherein orifices of the plurality of orifices contain chamfers on a surface of the plate.

15. The direct-contact fluid-based cooling module of claim 10, wherein orifices of the plurality of orifices form microjet nozzles.

16. The direct-contact fluid-based cooling module of claim 15, where the microjet nozzles direct the fluid in a direction substantially perpendicular to a surface of the nozzle plate, to create fluid flow with substantially high momentum in the perpendicular direction.

17. The direct-contact fluid-based cooling module of claim 10, wherein orifices of the plurality of orifices are configured non-uniformly across the nozzle plate, to provide more effective cooling for reduction of temperature gradients in the electronic component.

18. The direct-contact fluid-based cooling module of claim 1, wherein the manifold further comprises internal ribs or fins that increase a surface area of the manifold that is exposed to the fluid or enhance fluid flow, for enhancing heat transfer.

19. The direct-contact fluid-based cooling module of claim 1, wherein the fluid inlet and fluid outlet are in fluid communication with fluid fittings.

20. The direct-contact fluid-based cooling module of claim 1, wherein the fluid inlet and fluid outlet are in fluid communication with fluid conduits.

21. A direct-contact single-phase fluid-based cooling module for fluidly cooling an electronic component that is mounted to a printed circuit board (PCB), the cooling module comprising:
   a manifold formed from a material of low thermal conductivity and comprising a fluid inlet that is fluidly coupled to a fluid outlet, wherein the manifold is configured to be coupled to the PCB;
   manifold mounting structures that are configured to couple the manifold to the PCB; and
   a fluid-tight seal between the manifold and a surface of the electronic component;

wherein when fluid is passed through the manifold the fluid directly contacts the surface of the electronic component.

22. The direct-contact fluid-based cooling module of claim 21, wherein the manifold is configured to be removably coupled to the PCB and the manifold mounting structures are configured to removably couple the manifold to the PCB.

23. The direct-contact fluid-based cooling module of claim 21, wherein the manifold is formed from a polymer material.

24. A direct-contact single-phase fluid-based cooling module for fluidly cooling an electronic component that is mounted to a printed circuit board (PCB), the cooling module comprising:
- a manifold comprising a fluid inlet that is fluidly coupled to a fluid outlet, wherein the manifold is configured to be coupled to the PCB;
- manifold mounting structures that are configured to couple the manifold to the PCB; and
- a thermally non-conductive fluid-tight seal between the manifold and a surface of the electronic component;
- wherein when fluid is passed through the manifold the fluid directly contacts the surface of the electronic component.

* * * * *